(12) United States Patent
Kwack et al.

(10) Patent No.: US 7,161,852 B2
(45) Date of Patent: Jan. 9, 2007

(54) SEMICONDUCTOR MEMORY DEVICE WITH STABLE INTERNAL POWER SUPPLY VOLTAGE

(75) Inventors: Seung-Wook Kwack, Ichon-shi (KR); Kwan-Weon Kim, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 35 days.

(21) Appl. No.: 11/020,220

(22) Filed: Dec. 27, 2004

(65) Prior Publication Data

US 2006/0023522 A1    Feb. 2, 2006

(30) Foreign Application Priority Data

Jul. 13, 2004    (KR)    ...................... 10-2004-0054293

(51) Int. Cl.
*G11C 11/4074*    (2006.01)
(52) U.S. Cl. .................................. 365/189.11; 365/226
(58) Field of Classification Search ............ 365/189.11
See application file for complete search history.

(56) References Cited

U.S. PATENT DOCUMENTS

| | | | | |
|---|---|---|---|---|
| 5,452,253 A | * | 9/1995 | Choi | ........................... 365/201 |
| 6,327,198 B1 | * | 12/2001 | Kato et al. | ................... 365/201 |
| 6,587,916 B1 | * | 7/2003 | Hongo et al. | ................ 711/103 |
| 6,653,888 B1 | * | 11/2003 | Lee | ............................. 327/534 |
| 6,654,300 B1 | * | 11/2003 | Ikeda | .......................... 365/201 |
| 6,744,687 B1 | * | 6/2004 | Koo et al. | ................... 365/226 |
| 6,826,108 B1 | | 11/2004 | Kang | |
| 2004/0004876 A1 | | 1/2004 | Choi et al. | |

FOREIGN PATENT DOCUMENTS

KR    10-2002-0031838 A    5/2002

\* cited by examiner

*Primary Examiner*—Tan T. Nguyen
(74) *Attorney, Agent, or Firm*—McDermott Will & Emery LLP

(57) ABSTRACT

A semiconductor memory device having a register for stably generating an internal power supply voltage, including: a pumping circuit unit for generating the internal power supply voltage and adjusting a voltage level of the internal power supply voltage in response to a control signal; and a decoding unit for generating the control signal based on a plurality of address signals of the register.

14 Claims, 2 Drawing Sheets

SEMICONDUCTOR MEMORY DEVICE WITH STABLE INTERNAL POWER SUPPLY VOLTAGE

FIELD OF INVENTION

The present invention relates to a semiconductor memory device; and, more particularly, to a semiconductor memory device having a stable internal power supply voltage.

DESCRIPTION OF PRIOR ART

A dynamic random access memory (DRAM) has been continuously improved for increasing an operational speed and reducing a power supply voltage. As the power supply voltage for operating the DRAM becomes lower and lower, a variation and a voltage level of a threshold voltage of a transistor (Vt) greatly influences on a stability of the DRAM. Therefore, various internal power supply voltages generated from the power supply voltage are required to be stable.

FIG. 1 is a block diagram showing a conventional internal low power supply voltage (VBB) generation unit.

As shown, the conventional VBB generation unit includes a plurality of VBB pumping units. The plurality of VBB pumping units are placed in two regions, i.e., a CSPERI region and a NPERI region.

Each of the plurality of VBB pumping units generates the VBB by pumping an external power supply voltage in response to a pumping activation enable signal VBB_ACT_Enb.

The VBB has the lowest voltage level among various internal power supply voltages generated from the external power supply voltage. The VBB is supplied to a p-type substrate of a semiconductor memory device. Therefore, the VBB is required to be stable so that the semiconductor memory device can be stably operated.

However, a voltage level of the VBB can be lower than or higher than a required stable voltage level of the VBB due to variations of a manufacturing process or a temperature. In addition, the above-mentioned problem can also be generated due to variations of current consumption of the semiconductor memory device.

All of the plurality of VBB pumping units are initialized and begin to operate in response to a power-up signal pwrup and generates the VBB in response to the pumping activation enable signal VBB_ACT_Enb. Therefore, even though the generated VBB is lower than or higher than the required stable voltage level, the VBB can not be adjusted. In addition, although a voltage level of the VBB can be changed depending on a location where the conventional VBB generation unit is placed, the VBB can not be adjusted.

Meanwhile, the VBB may be adjusted by controlling an oscillation cycle of an oscillator for performing the pumping operation of the plurality of VBB pumping units. However, in this case, it takes long time for the plurality of VBB pumping units to perform the pumping operation.

Therefore, since a circuit should be revised or a connection line of a VBB pumping unit should be cut by FIB (Focused In Beam) for adjusting the VBB, a test time is delayed.

Meanwhile, a conventional circuit for generating an internal high power supply voltage (VPP) has the same structure with the conventional VBB generation unit shown in FIG. 1 and has the same problem mentioned above.

SUMMARY OF INVENTION

It is, therefore, an object of the present invention to provide a semiconductor memory device capable of stably generating an internal power supply voltage.

In accordance with an aspect of the present invention, there is provided a semiconductor memory device having a register for stably generating an internal power supply voltage, including: a pumping circuit unit for generating the internal power supply voltage and adjusting a voltage level of the internal power supply voltage in response to a control signal; and a decoding unit for generating the control signal based on a plurality of address signals of the register.

In accordance with another aspect of the present invention, there is provided a semiconductor memory device for stably generating an internal power supply voltage, including: a pumping circuit unit for generating the internal power supply voltage and adjusting a voltage level of the internal power supply voltage at a test mode in response to a control signal; and a decoding unit for generating the control signal in order to operate the pumping circuit unit at a normal mode or the test mode in response to a plurality of control signals.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
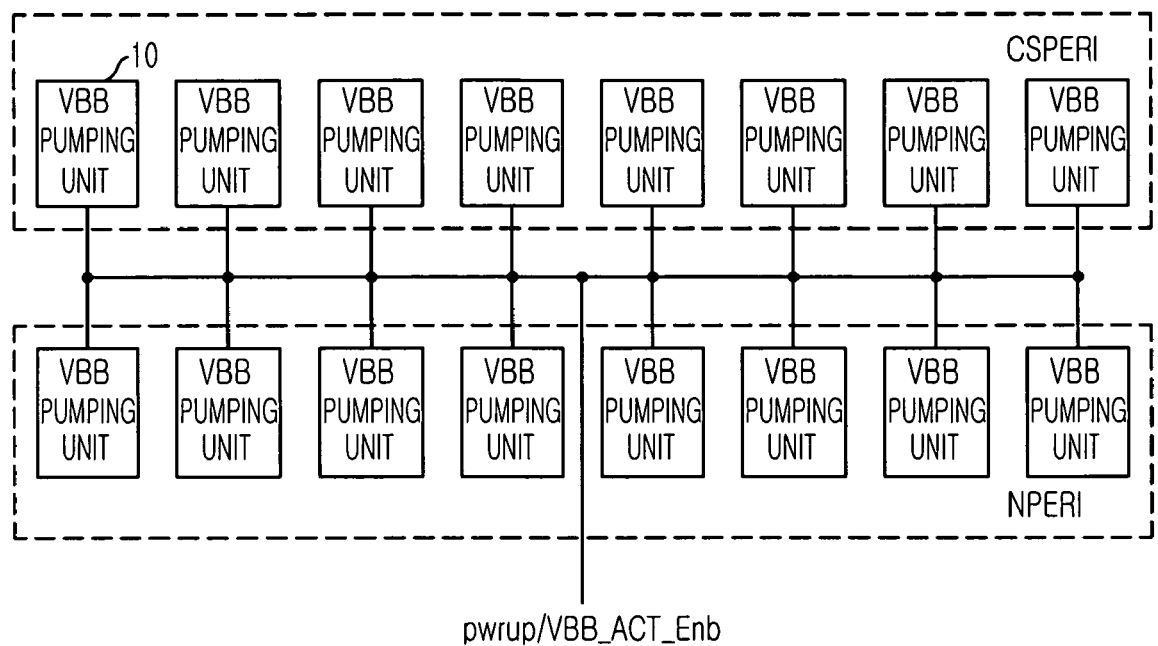
FIG. 1 is a block diagram showing a conventional internal low power supply voltage (VBB) generation unit.
Figure 2:
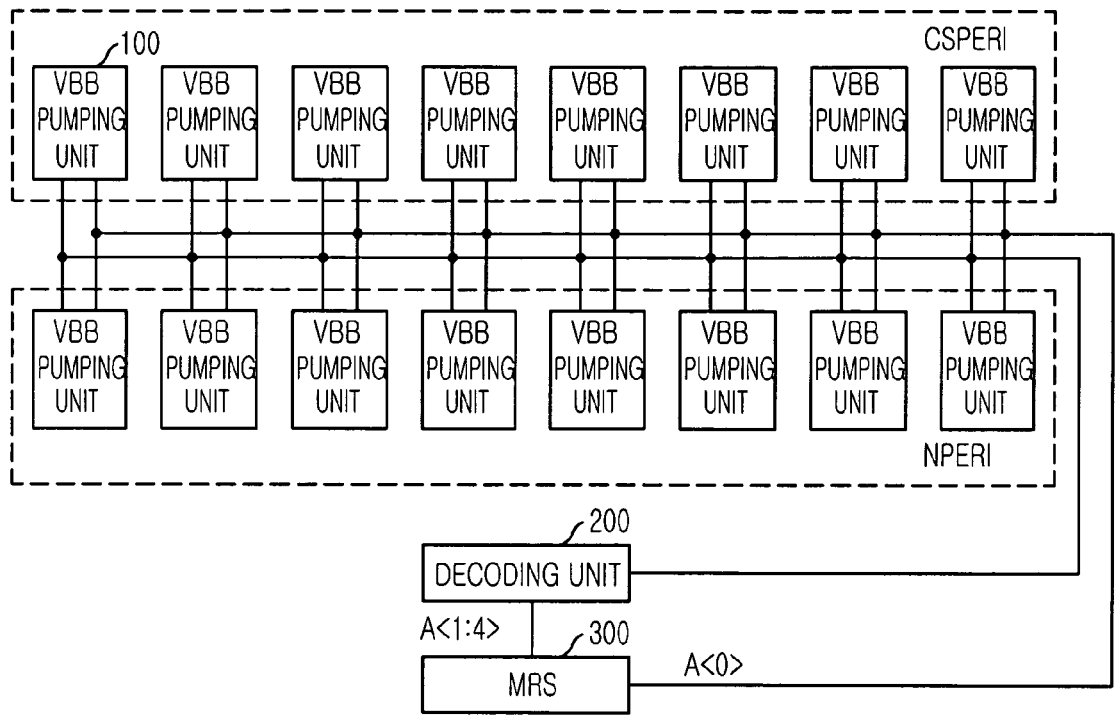
FIG. 2 is a block diagram showing an internal low power supply voltage (VBB) generation unit in accordance with a preferred embodiment of the present invention.

FIG. 2 is a block diagram showing an internal low power supply voltage (VBB) generation unit in accordance with a preferred embodiment of the present invention.

As shown, the VBB generation unit includes a plurality of VBB pumping units, a decoding unit 200 and a mode register set (MRS) 300.

The plurality of VBB pumping units generate the VBB by pumping an external power supply voltage. The decoding unit 200 receives a 4-bit address signal A<1:4> from the MRS 300 and decodes the 4-bit address signal A<1:4> for selectively operating the plurality of VBB pumping units.

Meanwhile, during a test mode, it cat be found out that how many VBB pumping units are required to be operated for the VBB to have a stable voltage level by variously setting the MRS. Locations of the VBB pumping units required to be operated are also can be found out. That is, in case that a voltage level of the VBB becomes higher than or lower than the stable voltage level due to variations of a manufacturing process and a temperature, the VBB can be adjusted to have the stable voltage level by selectively operating the plurality of VBB pumping units based on the MRS. This method of adjusting the VBB is faster than controlling an oscillation cycle of an oscillator for performing a pumping operation of the plurality of VBB pumping units.

A single-bit address signal A<0> of the MRS determines whether or not the VBB generation unit is controlled by the MRS. That is, if the single-bit address signal A<0> is in a logic high level, the plurality of VBB pumping units are selectively operated based on the MRS as described above. On the other hand, if the single-bit address signal A<0> is in a logic low level, the VBB generation unit is not controlled by the MRS, i.e., the VBB generation unit has the same operations with the conventional VBB generation unit.

In addition, the above-described embodiment can be applied to any pumping circuit for generating an internal power supply voltage from the external power supply voltage.

Figure 3:
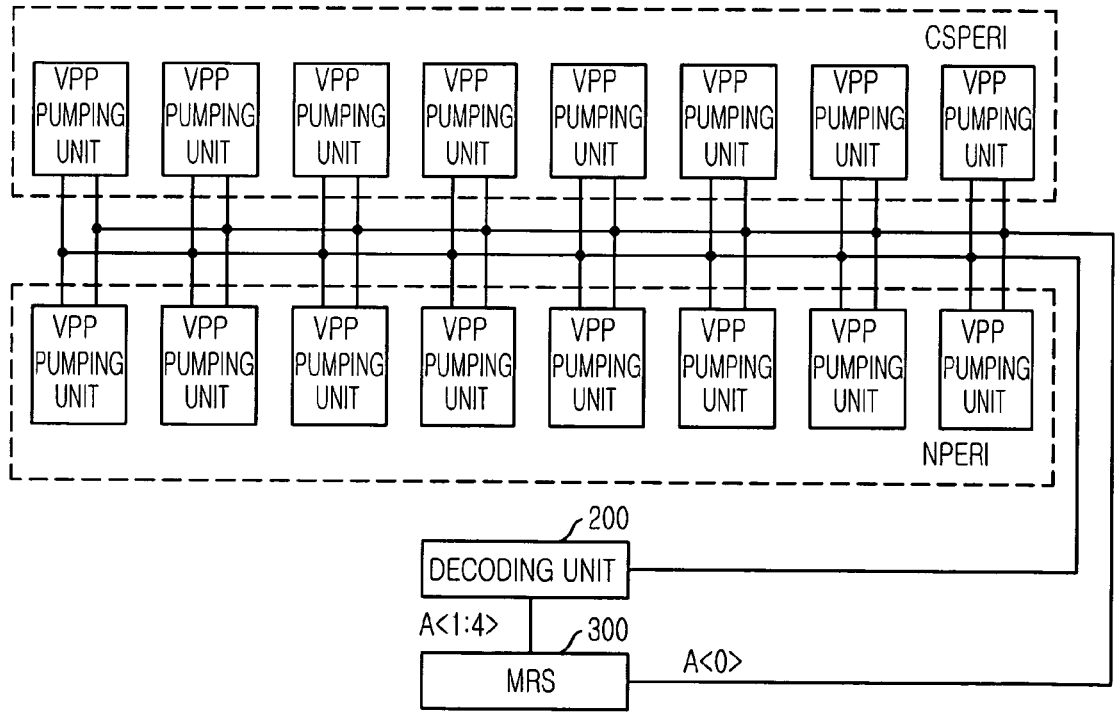
FIG. 3 is a block diagram showing an internal high power supply voltage (VPP) generation unit in accordance with another embodiment of the present invention.

FIG. 3 is a block diagram showing an internal high power supply voltage (VPP) generation unit in accordance with another embodiment of the present invention.

As shown, the VPP generation unit has the same structure and operations with the VBB generation unit shown in FIG. 2.

Therefore, the VPP generation unit can generate the VPP stably by selectively operating a VPP pumping unit.

In conclusion, in accordance with the present invention, an internal power supply voltage generated from the external power supply voltage can be fast adjusted to have a stable voltage level by selectively operating a pumping unit according to the MRS. Therefore, since the internal power supply voltage is stably generated regardless of variations of a manufacturing process and a temperature, a stability of a semiconductor memory device can be increased. In addition, a production yield of a semiconductor memory device also can be increased because a semiconductor memory device with an unstable internal power supply voltage can be fixed by setting the MRS.

Although the present invention uses the MRS for controlling a pumping circuit, an extended MRS (EMRS) also can be used for the same purpose.

The present application contains subject matter related to Korean patent application No. 2004-54293, filed in the Korean Patent Office on Jul. 13, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device having a register for stably generating an internal power supply voltage, comprising:
   a pumping circuit unit including a plurality of pumping circuits which are selectively operated based on a control signal and generating the internal power supply voltage and adjusting a voltage level of the internal power supply voltage in response to the control signal; and
   a decoding unit for generating the control signal based on a plurality of address signals of the register,
   wherein the register is a mode register set (MRS) or an extended mode register set (EMRS), and a first address signal of the plurality of address signals determines whether or not the plurality of pumping circuits are selectively operated.

2. The semiconductor memory device as recited in claim 1, wherein a second address signal to a fifth address signal of the plurality of address signals determine the number of pumping circuits to be operated.

3. The semiconductor memory device as recited in claim 2, wherein the internal power supply voltage is an internal low power supply voltage having lower voltage level than the external power supply voltage.

4. The semiconductor memory device as recited in claim 2, wherein the internal power supply voltage is an internal high power supply voltage having higher voltage level than the external power supply voltage.

5. A semiconductor memory device for stably generating an internal power supply voltage, comprising:
   a pumping circuit unit for generating the internal power supply voltage and adjusting a voltage level of the internal power supply voltage at a test mode in response to a control signal; and
   a decoding unit for generating the control signal in order to operate the pumping circuit unit at a normal mode or the test mode in response to a plurality of control signals,
   wherein the test mode or the normal mode is determined by a mode register set (MRS) or an extended mode register set (EMRS), and the plurality of control signals are plurality of address signals of the MRS or the EMRS.

6. The semiconductor memory device as recited in claim 5, wherein the pumping circuit unit includes a plurality of pumping circuits and the plurality of pumping circuits are selectively operated at the test mode, and all of the plurality of pumping circuits are operated at the normal mode.

7. The semiconductor memory device as recited in claim 6, wherein a first address signal of the plurality of address signals selects one of the test mode and the normal mode.

8. The semiconductor memory device as recited in claim 7, wherein a second address signal to a fifth address signal of the plurality of address signals determine the number of pumping circuits to be operated.

9. A semiconductor memory device, comprising:
   a register for outputting a plurality of address signals;
   a decoding unit for generating a control signal based on the plurality of address signals; and
   a plurality of pumping circuits for generating an internal power supply voltage and adjusting a voltage level of the internal power supply voltage in response to the control signal,
   wherein a first address signal of the plurality of address signals determines whether the plurality of pumping circuits are selectively operated or not.

10. The semiconductor memory device as recited in claim 9, wherein the register is a mode register set (MRS) or an extended mode register set (EMRS).

11. The semiconductor memory device as recited in claim 10, wherein the plurality of pumping circuits are selectively operated based on the control signal.

12. The semiconductor memory device as recited in claim 11, wherein a second address signal to a fifth address signal of the plurality of address signals determine the number of pumping circuits to be operated.

13. The semiconductor memory device as recited in claim 12, wherein the internal power supply voltage is an internal low power supply voltage having lower voltage level than the external power supply voltage.

14. The semiconductor memory device as recited in claim 12, wherein the internal power supply voltage is an internal high power supply voltage having higher voltage level than the external power supply voltage.

* * * * *